United States Patent [19]

Kobayashi et al.

[11] Patent Number: 4,734,709
[45] Date of Patent: Mar. 29, 1988

[54] THERMAL HEAD AND METHOD FOR FABRICATING

[75] Inventors: Kenichi Kobayashi; Hiroshi Fujimagari, both of Ebina, Japan

[73] Assignee: Fuji Xerox Co., Ltd., Ebina, Japan

[21] Appl. No.: 856,387

[22] Filed: Apr. 28, 1986

[30] Foreign Application Priority Data

May 7, 1985 [JP] Japan .................. 60-96373

[51] Int. Cl.[4] ...................... G01D 15/10; H01C 1/012; B05D 5/12
[52] U.S. Cl. ............................. 346/76 PH; 219/216; 338/308; 427/58; 427/96
[58] Field of Search .................. 346/76 PH; 219/216; 338/308; 428/539.5; 427/58, 96

[56] References Cited

U.S. PATENT DOCUMENTS 3,763,026 10/1973 Cordes ............................... 338/308
4,136,274 1/1979 Shibata et al. ..................... 219/216

FOREIGN PATENT DOCUMENTS 1015143 12/1965 United Kingdom .
1247269 9/1971 United Kingdom .
1249951 10/1971 United Kingdom .
1503969 3/1978 United Kingdom .

OTHER PUBLICATIONS

IBM Technical Disclosure Bulletin, vol. 27, No. 3, Aug. 1984, Printhead Structure, H. Matino.
IBM Technical Disclosure Bulletin, vol. 23, No. 2, Jul. 1980, Thermal Print Head Structure, Matino.

Primary Examiner—E. A. Goldberg
Assistant Examiner—Gerald E. Preston
Attorney, Agent, or Firm—Welsh & Katz, Ltd.

[57] ABSTRACT

A thermal head which comprises a heating resistor film made of tantalum nitride orientated in (101) direction by a reactive sputtering process.

5 Claims, 8 Drawing Figures

4,734,709

THERMAL HEAD AND METHOD FOR FABRICATING

BACKGROUND OF THE INVENTION

1. Field of the Invention

The present invention relates to a thermal head and a method for fabricating the same and, more specifically, to a crystalline structure in a heating film of a thermal head.

2. Description of the Prior Art

There has been a thermal recording system which thermally records picture information by bringing into slidable contact with the recording medium a thermally recording head (thermal head) comprising heating resistor elements each selectively heated according to the picture information. As good-performance heating elements and heat-sensitive materials have recently been developed, increasing attention is now directed to this system.

The thermal head used in such a thermally recording system is divided into three types, that is, thick film, thin film and semiconductor types. Of these three types, the thick film and semiconductor type thermal heads are considered to need further researches at the current stage because heating resistors employed in these types are not completely known in many points including physical property change of the resistors with time when subjected to repetitive thermal shocks and high-temperature thermal pulses.

On the other hand, heating resistor employed in the thin film type thermal head has relatively short life when operated under severe conditions, but is suitable for high speed printing because of its small heat capacity. In addition, this type is good in the bonding property to its substrate and excellent in mechanical strength. For such reasons, the thin film type is getting attention as a demand for high speed printing increases.

The thin film type thermal head usually comprises an insulating substrate, a grazed layer formed on the substrate, a heating resistor layer provided on the grazed layer, a plurality of electrodes juxtaposed to each other on the resistive layer for supplying electric power to the layer, and a protective layer made of frictional-wear-resistant material coated on the electrodes.

The heating resistive layer is generally made of tantalum nitride ($Ta_2 N$), nichrome (NiCr), tantalum-silicon dioxide ($Ta-SiO_2$) or the like.

Of these materials, tantalum nitride, which does not exist in nature, is prepared by a reactive sputtering process. More specifically, tantalum as target is sputtered in an atmosphere of a mixture of argon and nitrogen gases to emit tantalum atoms. The atoms are reacted with the nitrogen gas to form a thin tantalum nitride film. The composition of the formed thin film varies depending on the partial pressure of nitrogen during the sputtering and the physical properties of the thin film vary correspondingly. Thus, characteristic values of the film depend largely on the structure of sputtering apparatus and film preparation conditions. For this reason, the thin film which is used as heating resistors has been prepared in a region in which specific resistance and resistance temperature coefficient (TCR) vary only to a small extent with respect to change in the nitrogen partial pressure, that is, in a flat region called a plateau as shown in FIG. 8 where the specific resistance and TCR are plotted with respect to the nitrogen partial pressure.

Meanwhile, when it is desired to drive the thermal head for high-speed printing, a large electric power though momentarily must be repetitively applied to the heating resistors of the thermal head, making of tantalum nitride as mentioned above rapidly deteriorated. For this reason, there has been strongly demanded a heating resistor that has a long operational life and a high operational reliability.

SUMMARY OF THE INVENTION

It is an object of the present invention to provide a thermal head which has a long operational life and a high operational reliability.

In a thermal head according to the present invention, a heating layer is made of tantalum nitride orientated in (101) direction.

In a method of fabricating a thermal head according to the present invention, a heating film is a tantalum nitride film ($Ta_2 N$) which is formed by a reactive sputtering process in which nitrogen partial pressure is set such that the tantalum nitride is orientated in (101) direction.

That is, the present invention is made while paying attention to the fact that the tantalum nitride prepared by the reactive sputtering process has different crystalline structures even within its plateau region and difference in crystalline structures of tantalum nitride used as the material of a heating resistive layer makes durability of the heating resistor layer against repetitive thermal pulses different. In accordance with the present invention, a tantalum nitride film is formed to be orientated (101) direction in a part of a plateau region in which the nitrogen partial pressure is lower.

According to the reactive sputtering process, a tantalum nitride film orientated in the (101) direction can be easily obtained by controlling the nitrogen partial pressure to be lower.

Use of the heating resistor film having such a crystalline structure enables realization of a thermal head which is stable with time and highly reliable in operation.

DESCRIPTION OF THE PREFERRED EMBODIMENT

Figure 1:
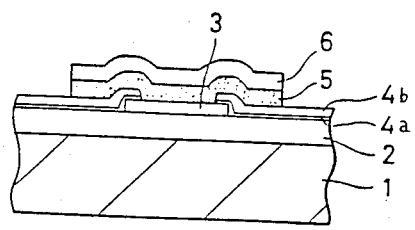
FIG. 1 is a cross-sectional view, in part, of a thermal head according to an embodiment of the present invention.

Referring to FIG. 1, there is shown a major part, in section, of a thermal head according to the present invention, which comprises an alumina substrate 1, a grazed layer 2 formed on the substrate, a thin heating resistor layer 3 made of tantalum nitride ($Ta_2N$) having a hexagonal close-packed lattice (h.c.p) structure orientated in (101) direction, nichrome thin film 4a and gold thin films 4b as electrodes for supplying electric power to the heating resistor layer 3, a silicon dioxide film 5 as an acid-resistant film coated on these films, and a tantalum pentoxide film 6 as a frictional-wear-resistant film; these films, layer and substrate forming a heating resistor element section R. Plurality of such sections R are juxtaposed to each other at a density of 8 sections/mm.

Figure 2:
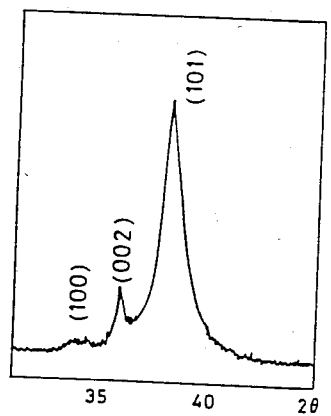
FIG. 2 shows a structure analysis result of a heating resistor film used in the same thermal head when the film is subjected to an X-ray diffraction.

Next, explanation will be made as to a method of fabricating the thermal head. First of all, using an RF magnetron sputtering apparatus, sputtering is carried out on the alumina substrate 1 on which the grazed layer 2 is formed at a sputtering pressure of 0.55 Pa and a nitrogen partial pressure of $1.5 \times 10^{-2}$ Pa with RF power of 0.5 kW with use of tantalum as target to form a thin film 3 of tantalum nitride ($Ta_2N$). As seen from the analysis results of the crystalline structure through an X-ray diffraction in FIG. 2, the thin tantalum nitride film of the heating resistor layer 3 has a (h.c.p) structure orientated in (101) direction.

By performing a known photolitho-etching to the thusformed film 3, a heating resistor layer having a desired heating resistor pattern can be obtained.

Then, the thin nichrome film 4a and the gold thin film 4b are sequentially coated on the heating resistor pattern by an evaporation process and subjected to a similar photolitho-etching to form an electrode pattern.

Finally, the acid-resistant silicon dioxide film 5 and the frictional-wear-resistant tantalum pentoxide film 6 are successively formed.

Figure 3:
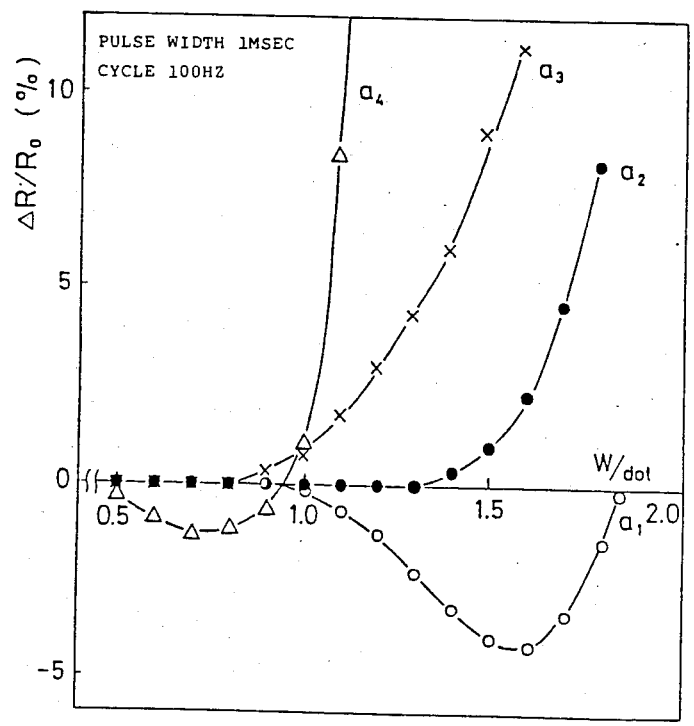
FIG. 3 shows variations in resistance of the thermal head of the embodiment and of a prior art thermal head, when the heads are subjected to a step-up stress test.

The thus-obtained thermal head was subjected to a step-up stress test, the results of which are shown by a curve $a_1$ in FIG. 3. The curve $a_1$ shows that the rate of change of the resistance $\Delta R/R_o$ is very small and the breakdown power is as large as 1.85 w/dot that is withstandable for a large power.

In the step-up stress test, a proper power pulse having a pulse width of 1 msec and a period of 100 Hz is applied to the thermal head for a predetermined time (3 minutes, in this embodiment), stopped for a predetermined time (5 minutes), and then changes $\Delta R$ with respect to an initial resistance $R_o$ are measured. Then, the application power is increased and the changes $\Delta R$ with respect to the initial resistance $R_o$ at respective steps are measured in the same manner. In FIG. 3, the ordinate axis denotes $\Delta R/R_o$ and the abscissa axis denotes application power (w/dot).

Figure 4:
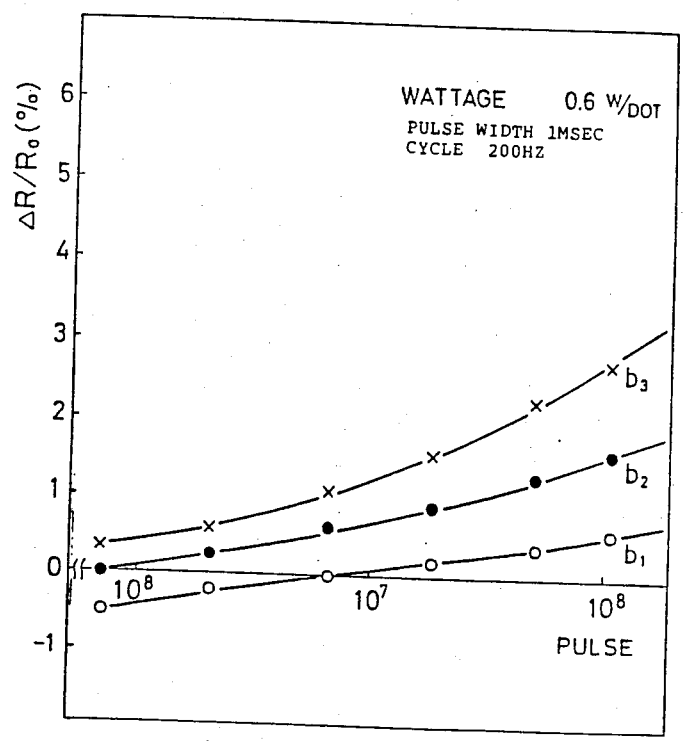
FIG. 4 shows variations in resistance of the thermal heads of the embodiment and prior art, when the heads are subjected to a continuous pulse test.

FIG. 4 shows results of a continuous pulse test on the thermal head by a curve $b_1$. In this case, the test exhibits good results.

In the continuous pulse test, a pulse power of 0.6 w/dot with a pulse width of 1 msec and a period of 200 Hz is continuously applied to the thermal head. The changes $\Delta R$ with respect to the initial resistance $R_o$ caused by increases in the number of such application pulses are measured.

Figure 5:
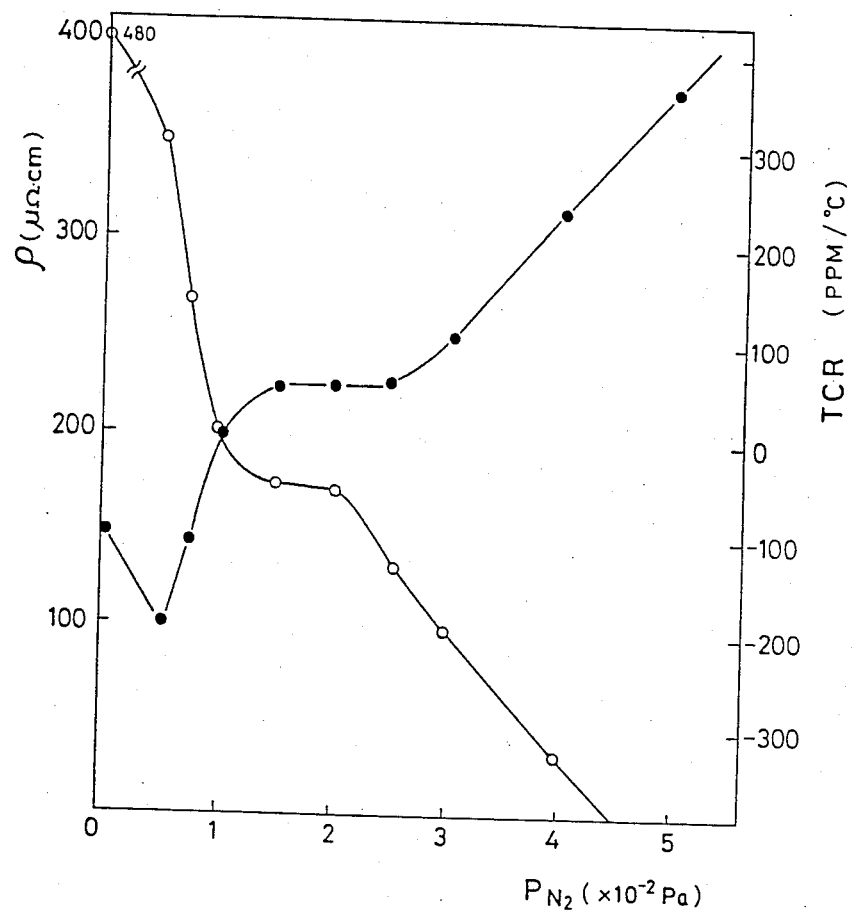
FIG. 5 shows relationships between the nitrogen partial pressure, specific resistance and TCR at the time of forming a tantalum nitride by an RF magnetron sputtering process.

For comparison, curves in FIG. 5 show relationship between the specific resistance $\rho$ ($\mu\Omega$ cm), TCR (PPM/° C.) and nitrogen partial pressure $P_{N2}$ ($\times 10^{-2}$ Pa) of thin films obtained by the RF magnetron sputtering process under the same conditions as in the embodiment except that the nitrogen partial pressure $P_{N2}$ is changed within a range of 0 to $7 \times 10^{-2}$ Pa, where black dots denote specific resistance and white dots denote TCR respectively.

Figure 6:
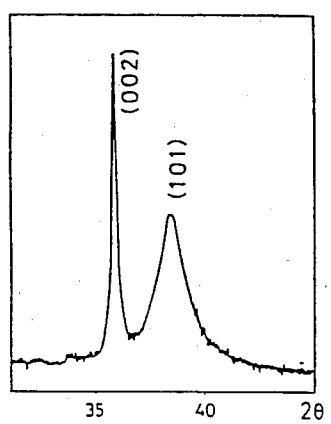
FIGS. 6 and 7 show structure analysis results of tantalum nitride films formed at nitrogen partial pressures of $2.0 \times 10^{-2}$ Pa and $2.5 \times 10^{-2}$ Pa when the films are subjected to an X-ray diffraction, respectively.
Figure 7:
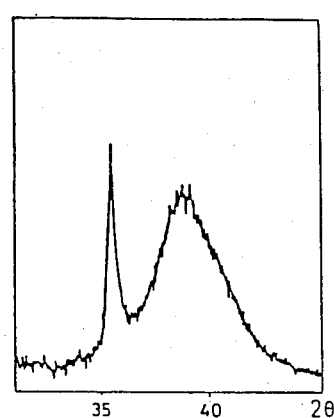
Figure 8:
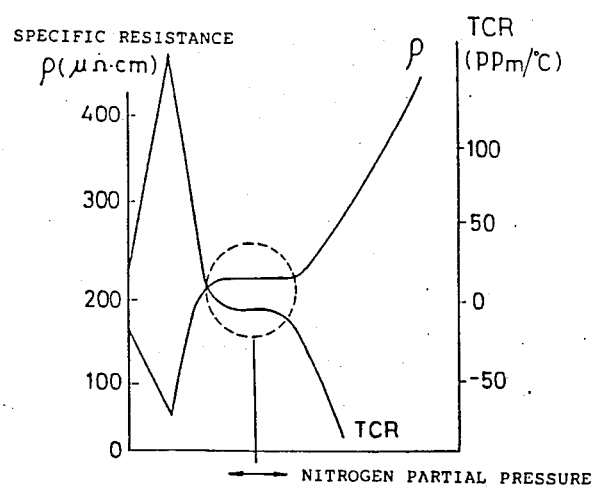
FIG. 8 is a graph showing a characteristic region used for a heating resistor film in a prior art thermal head.

Films corresponding to a platteau region in FIG. 5 were subjected to an X-ray diffraction, and FIGS. 6 and 7 show the analysis results of crystalline structures of the film, respectively. That is, FIGS. 6 and 7 show the tantalum nitride films obtained at nitrogen partial pressures of $2.0 \times 10^{-2}$ Pa and $2.5 \times 10^{-2}$ Pa, respectively. As clear from these drawings, tantalum nitride ($Ta_2N$) having a (h.c.p) structure orientated in (002) direction is formed when the nitrogen partial pressure $P_{N2}$ is $2 \times 10^{-2}$ Pa, while both tantalum nitride ($Ta_2N$) having the (h.c.p) structure and tantalum nitride (TaN) having a face-centered cubic lattice (f.c.c) structure are formed when the nitrogen partial pressure $P_{N2}$ is $2.5 \times 10^{-2}$ Pa.

Thermal heads fabricated with use of tantalum nitride films formed by the RF magnetron sputtering process under the same conditions as in the embodiment except that the nitrogen partial pressure are $2.0 \times 10^{-2}$ Pa, $2.5 \times 10^{-2}$ Pa and $5.0 \times 10^{-2}$ Pa, were subjected to the similar step-up stress test and continuous pulse test (which is not conducted for $5.0 \times 10$ Pa). FIGS. 3 and 4 show the test results by curves $a_2$ ($2.0 \times 10^{-2}$ Pa), $a_3$ ($2.5 \times 10^{-2}$ Pa), $a_4$ ($5.0 \times 10^{-2}$ Pa) and $b_2$ ($2.0 \times 10^{-2}$ Pa), $b_3$ ($2.5 \times 10^{-2}$ Pa), respectively.

It will be appreciated from comparison between these curves $a_1$ to $a_4$ and $b_1$ to $b_3$ that when the thin tantalum nitride films orientated in the (101) direction (corresponding to the curves $a_1$ and $b_1$) are used in the thermal heads, the head have an excellent durability against thermal pulse in the both steps-up stress and continuous pulse tests.

In the embodiment, with nitrogen partial pressure being $1.0-1.9 \times 10^{-2}$ Pa, a thermal head having tantalum nitride film of (101) direction can be obtained. If the nitrogen partial pressure is lower than $1.0 \times 10^{-2}$ Pa, the reactive sputtering process is conducted out of the plateau reagion, making it difficult to fabricate a thermal head of good performance in a stable manner. On the other hand, if the pressure is higher than $1.9 \times 10^{-2}$ Pa, the tantalum nitride film is orientated other than (101) direction, shortening the life and lowering reliability of the thermal head.

Although the heating resistor film has been prepared by the RF magnetron sputtering process in the illustrated embodiment, other sputtering process such as a DC magnetron sputtering process may be employed.

What is claimed is:

1. A thermal head comprising an electrode pattern and a heating resistor film, for printing picture information by selectively supplying power to the heating resistor film so as to heat said film according to said picture information, characterized in that said heating resistor film is made of tantalum nitride ($Ta_2N$) a hexagonal close-packed lattice orientated in (101) direction.

2. A method of fabricating a thermal head for printing picture information by selectively supplying power to a heating resistor film of the thermal head so as to heat said film according to said picture information, said method comprises the steps of forming an electrode pattern and forming the heating resistor film, characterized in that therefor the heating resistor film includes a step of forming the tantalum nitride film orientated in (101) direction under a controlled nitrogen partial pressure by a reactive sputtering process.

3. A method as set forth in claim 2, wherein said reactive sputtering process is an RF magnetron sputtering process.

4. A method as set forth in claim 2, wherein said reactive sputtering process is carried out at a nitrogen partial pressure in the range of about $1.0 \times 10^{-2}$ Pa to about $1.9 \times 10^{-2}$ Pa.

5. A method of fabricating a thermal head for printing picture information by selectively supplying power to a heating resistor film of the thermal head so as to heat said film according to said picture information, said method comprising the steps of forming an electrode pattern and forming the heating resistor film, characterized in that the step of forming the heating resistor film includes a step of forming the tantalum nitride film in a hexagonal close-packed lattice orientated in (101) direction under a controlled nitrogen partial pressure of about $1.0 \times 10^{-2}$ Pa to about $1.9 \times 10^{-2}$ Pa by a reactive sputtering process.

* * * * *

UNITED STATES PATENT AND TRADEMARK OFFICE
CERTIFICATE OF CORRECTION

PATENT NO. : 4,734,709

DATED : March 29, 1988

INVENTOR(S) : Kobayashi et al.

It is certified that error appears in the above-identified patent and that said Letters Patent is hereby corrected as shown below:

Column 4, line 10, "platteau" should be --plateau--.

Column 4, line 37, "head" should be --heads--.

Column 4, line 38, "in the both" should be --in both the--.

Column 4, line 45, "reagion" should be --region--.

Column 4, line 67, "comprises" should be --comprising--.

Column 5, line 1, "therefor" should be --the step of forming--.

Signed and Sealed this

Twentieth Day of December, 1988

*Attest:*

DONALD J. QUIGG

*Attesting Officer*   *Commissioner of Patents and Trademarks*